United States Patent
Lu et al.

(10) Patent No.: US 11,991,825 B2
(45) Date of Patent: May 21, 2024

(54) FLEXIBLE CIRCUIT BOARD, LIGHT BAR, LIGHT SOURCE AND DISPLAY DEVICE

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Yuanda Lu, Beijing (CN); Junjie Ma, Beijing (CN); Shipeng Wang, Beijing (CN); Ming Zhai, Beijing (CN); Jian Sang, Beijing (CN); Haiwei Sun, Beijing (CN); Dongjia Hao, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 750 days.

(21) Appl. No.: 16/392,112

(22) Filed: Apr. 23, 2019

(65) Prior Publication Data
US 2020/0025997 A1    Jan. 23, 2020

(30) Foreign Application Priority Data
Jul. 20, 2018  (CN) .......................... 201810804042.9

(51) Int. Cl.
*F21V 8/00*   (2006.01)
*H01R 12/65*  (2011.01)
(Continued)

(52) U.S. Cl.
CPC ............. *H05K 1/118* (2013.01); *H01R 12/65* (2013.01); *H05K 1/028* (2013.01); *H05K 1/111* (2013.01);
(Continued)

(58) Field of Classification Search
CPC ........ H05K 1/111; H05K 1/118; H05K 1/028; H05K 2201/09372; H05K 2201/09409;
(Continued)

(56) References Cited

U.S. PATENT DOCUMENTS 5,061,830 A * 10/1991 Ambrose ............. H01H 13/807
361/749
5,228,192 A *  7/1993 Salatino ................. H05K 1/189
228/264

(Continued)

*Primary Examiner* — Paresh Paghadal
(74) *Attorney, Agent, or Firm* — Nath, Goldberg & Meyer; Joshua B. Goldberg

(57) ABSTRACT

The present disclosure provides a flexible circuit board, a light bar, a light source and a display device. The light source includes a flexible circuit board having at least one effective welding portion and a light bar having at least one effective pad, the at least one effective welding portion being in one-to-one correspondence with the at least one effective pad, and the effective welding portion being fixed to a corresponding effective pad to transmit a signal loaded by itself to the corresponding effective pad. The flexible circuit board further includes at least one auxiliary welding portion, the light bar further includes at least one auxiliary pad that is in one-to-one correspondence with the at least one auxiliary welding portion, and the auxiliary welding portion is fixed to a corresponding auxiliary pad to enhance the firm fixing between the flexible circuit board and the light bar.

5 Claims, 5 Drawing Sheets

(51) Int. Cl.
 *H05K 1/02* (2006.01)
 *H05K 1/11* (2006.01)

(52) U.S. Cl.
 CPC .......... *H05K 2201/09372* (2013.01); *H05K 2201/09409* (2013.01); *H05K 2201/09418* (2013.01); *H05K 2201/09781* (2013.01); *H05K 2201/10378* (2013.01)

(58) Field of Classification Search
 CPC .......... H05K 2201/09418; H05K 2201/09781; H05K 2201/10378
 See application file for complete search history.

(56) References Cited

U.S. PATENT DOCUMENTS

| | | | | |
|---|---|---|---|---|
| 5,313,128 A * | 5/1994 | Robinson | ............... | H02K 3/50 174/117 A |
| 5,493,159 A * | 2/1996 | Norris | ............... | H02K 5/225 310/71 |
| 6,118,666 A * | 9/2000 | Aoki | ............... | H01R 12/61 174/254 |
| 7,696,441 B2 * | 4/2010 | Kataoka | ............... | H05K 1/028 174/254 |
| 8,982,112 B2 * | 3/2015 | Kim | ............... | G02F 1/13458 345/213 |
| 10,038,264 B2 * | 7/2018 | Lukofsky | ............... | H05K 3/361 |
| 2009/0225253 A1 * | 9/2009 | Oohira | ............... | G02B 6/0083 349/58 |
| 2012/0176564 A1 * | 7/2012 | Hatakeyama | ............... | G02F 1/1345 349/62 |
| 2018/0146551 A1 * | 5/2018 | Kida | ............... | H05K 3/361 |
| 2019/0348357 A1 * | 11/2019 | Lee | ............... | H05K 1/147 |
| 2020/0084883 A1 * | 3/2020 | Zhao | ............... | H05K 1/189 |
| 2020/0323584 A1 * | 10/2020 | Daly | ............... | A61B 18/00 |
| 2020/0326470 A1 * | 10/2020 | Kyoukane | ............... | H05K 1/189 |
| 2021/0059046 A1 * | 2/2021 | Koshimizu | ............... | H05K 1/0393 |

* cited by examiner

FLEXIBLE CIRCUIT BOARD, LIGHT BAR, LIGHT SOURCE AND DISPLAY DEVICE

CROSS-REFERENCE TO RELATED APPLICATION

This application claims priority from Chinese patent application No. 201810804042.9 filed with the China National Intellectual Property Administration on Jul. 20, 2018, the disclosure of which is incorporated herein by reference in its entirety.

TECHNICAL FIELD

The present disclosure relates to the field of display technology, and particularly relates to a flexible circuit board, a light bar, a light source, and a display device.

BACKGROUND

Backlight module is one of the components of a liquid crystal display device, while light source is a core device of the backlight module. A light source typically includes a flexible circuit board and a light bar that are fixed together by welding.

When the flexible circuit board and the light bar are fixed, the flexible circuit board is generally required to be bent in order to facilitate subsequent assembly, but the bent flexible circuit board often generates a pulling force on the light bar. In practical applications, it is found that due to limited welding positions between the flexible circuit board and the light bar (a limited bearable maximum pulling force), a breakage (i.e., "cold joint") will occur at some or all of the welding positions under an action of the pulling force, thus affecting transmission of light emitting signals.

SUMMARY of the problems in the related art. The present disclosure provides a flexible circuit board, a light bar, a light source and a display device.

According to an aspect of the present disclosure, there is provided a flexible circuit board for being fixed to a light bar to provided a signal for the light bar, the flexible circuit board including:
at least one effective welding portion configured to be fixed to a corresponding effective pad on the light bar and to transmit a signal loaded by itself to the corresponding effective pad; and
at least one auxiliary welding portion configured to be fixed to a corresponding auxiliary pad on the light bar to enhance firm fixing between the flexible circuit board and the light bar.

In some embodiments, the flexible circuit board further includes:
a circuit body;
at least one lead portion leading out of the circuit body; and
at least one fixing portion disposed in one-to-one correspondence with the at least one lead portion,
wherein each fixing portion is connected to an end of a corresponding lead portion, the effective welding portion and the auxiliary welding portion are both disposed on the at least one fixing portion, and each fixing portion is provided with at least one effective welding portion and at least one auxiliary welding portion.

In some embodiments, a plurality of lead portions are provided.

In some embodiments, on each fixing portion, a distance between an auxiliary welding portion furthest from the end of the corresponding lead portion and the end of the corresponding lead portion is marked as L1; and
a distance between an effective welding portion closest to the end of the corresponding lead portion and the end of the corresponding lead portion is marked as L2;
where L2 is greater than L1.

In some embodiments, each fixing portion is provided with one auxiliary welding portion and two effective welding portions respectively located at two sides of the one auxiliary welding portion.

In some embodiments, a length of the auxiliary welding portion in a length direction of the fixing portion is greater than a width of the lead portion in the length direction of the fixing portion.

In some embodiments, the flexible circuit board further includes at least one pressing member that is overlapped with the at least one fixing portion in one-to-one correspondence to press a corresponding fixing portion.

In some embodiments, the pressing member includes a protrusion configured to press the auxiliary welding portion.

According to another aspect of the present disclosure, there is provided a light bar for fixing to a flexible circuit board and receiving a signal provided by the flexible circuit board, the light bar including:
at least one effective pad configured to be fixed to a corresponding effective welding portion on the flexible circuit board and to acquire a signal transmitted by the corresponding effective welding portion; and
at least one auxiliary pad configured to be fixed to a corresponding auxiliary welding portion on the flexible circuit board to enhance firm fixing between the flexible circuit board and the light bar.

In some embodiments, the light bar is divided into at least one welding region which is in one-to-one correspondence with at least one fixing portion preset on the flexible circuit board; and
the effective pad and the auxiliary pad are both located in the at least one welding region, and each welding region is provided with at least one effective pad and at least one auxiliary pad.

In some embodiments, a plurality of welding regions are provided.

In some embodiments, each welding region is provided with one auxiliary pad and two effective pads respectively located at two sides of the one auxiliary pad.

In some embodiments, at least one of the effective pads is an positive electrode pad; and
the auxiliary pad is connected in parallel with the positive electrode pad.

According to yet another aspect of the present disclosure, there is provided a light source including a flexible circuit board having at least one effective welding portion, and a light bar having at least one effective pad, the at least one effective welding portion being in one-to-one correspondence with the at least one effective pad, and the effective welding portion being fixed to a corresponding effective pad to transmit a signal loaded by itself to the corresponding effective pad, wherein the flexible circuit board further includes at least one auxiliary welding portion, the light bar further includes at least one auxiliary pad, the at least one auxiliary welding portion is in one-to-one correspondence with the at least one auxiliary pad, and the auxiliary welding portion is fixed to a corresponding auxiliary pad to enhance firm fixing between the flexible circuit board and the light bar.

In some embodiments, the flexible circuit board further includes: a circuit body, at least one lead portion leading out of the circuit body, and at least one fixing portion in one-to-one correspondence with the at least one lead portion, each fixing portion being connected to an end of a corresponding lead portion, the effective welding portion and the auxiliary welding portion are both disposed on the at least one fixing portion, and each fixing portion is provided with at least one effective welding portion and at least one auxiliary welding portion; and the light bar is divided into at least one welding region which is in one-to-one correspondence with the at least one fixing portion, the effective pad and the auxiliary pad are both disposed in the at least one welding region, and each welding region is provided with at least one effective pad and at least one auxiliary pad.

In some embodiments, each fixing portion is provided with one auxiliary welding portion and two effective welding portions respectively located at two sides of the one auxiliary welding portion; and each welding region is provided with one auxiliary pad and two effective pads respectively located at two sides of the one auxiliary pad.

According to still another aspect of the present disclosure, there is provided a display device including the above light source.

DETAILED DESCRIPTION

To improve understanding of the technical solution of the present disclosure for those skilled in the art, the flexible circuit board, the light bar, the light source and the display device provided by the present disclosure will now be described in detail in conjunction with accompanying drawings.

Figure 1:
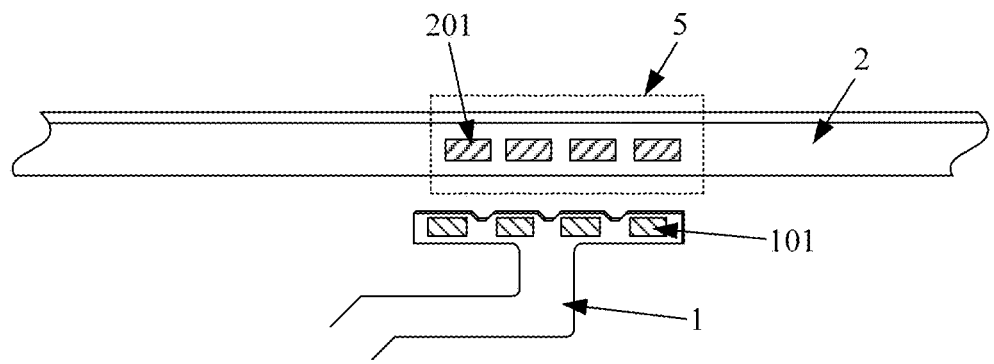
FIG. 1 is a schematic structural view showing a flexible circuit board and a light bar according to an exemplary embodiment of the present disclosure.
Figure 2:
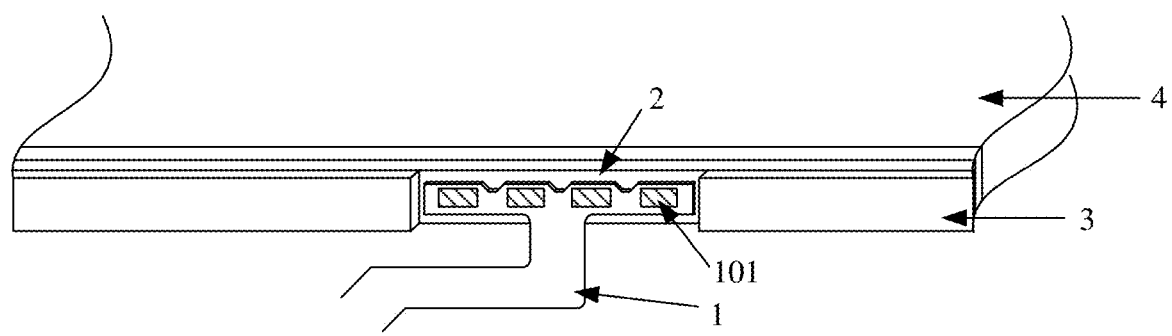
FIG. 2 is a schematic view of the flexible circuit board and the light bar of FIG. 1 being welded.
Figure 3:
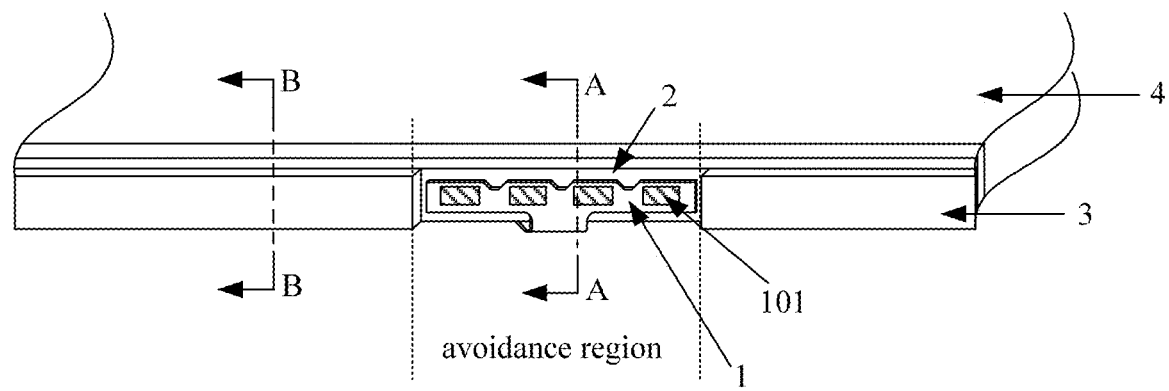
FIG. 3 is a schematic view of the flexible circuit board of FIG. 1 folded to a back side of the back plate after the flexible circuit board and the light bar are welded.

In an exemplary embodiment of the present disclosure, there is provided a flexible circuit board and a light bar. FIG. 1 is a schematic structural view showing a flexible circuit board and a light bar according to an exemplary embodiment of the present disclosure; FIG. 2 is a schematic view of the flexible circuit board and the light bar of FIG. 1 being welded; FIG. 3 is a schematic view of the flexible circuit board of FIG. 1 folded to a back side of the back plate after the flexible circuit board and the light bar are welded. As shown in FIGS. 1 to 3, a plurality of (e.g., four) effective welding portions 101 to be used for welding are disposed on an end of a flexible circuit board 1, and one welding region 5 is divided out in the light bar 2, where a plurality of (e.g., four) effective pads 201 to be used for welding with the effective welding portions 101 are provided. After the respective effective welding portions 101 on the flexible circuit board 1 are welded and fixed to the corresponding effective pads 201 on the light bar 2, a circuit body 11 of the flexible circuit board 1 is partially bent to a back side of a back plate 3. Thus, an assembly formed of the flexible circuit board and the light bar are assembled for later use.

However, in the above configuration of the flexible circuit board and the light bar, the bent portion of the flexible circuit board 1 tends to apply a pulling force on the light bar 2 through a welding position during bending. Due to the limited number of effective pads 201 and effective welding portions 101, a bearable maximum pulling force between the flexible circuit board 1 and the light bar 2 is limited. When the pulling force produced by the flexible circuit board 1 due to bending is greater than or close to the bearable maximum pulling force between the two, a breakage may occur at some or even all of the effective welding points (positions where the effective welding portion 101 and the corresponding effective pad 201 are welded).

Figure 4A:
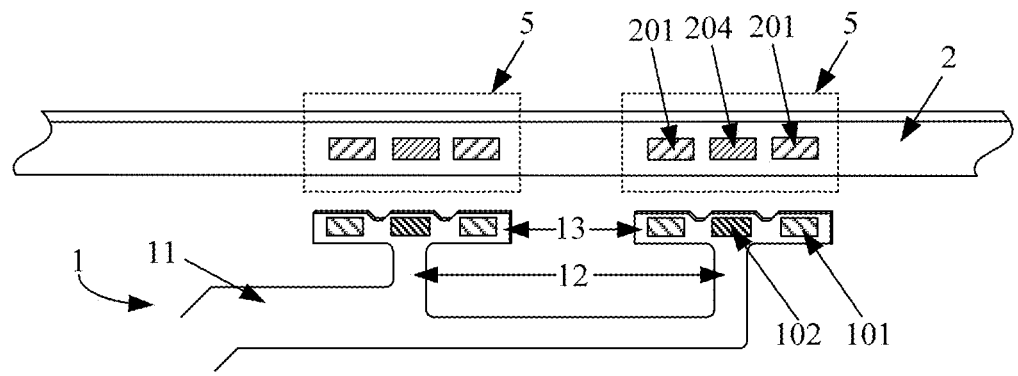
FIG. 4A is a schematic structural view showing another flexible circuit board and light bar according to an exemplary embodiment of the present disclosure.
Figure 5:
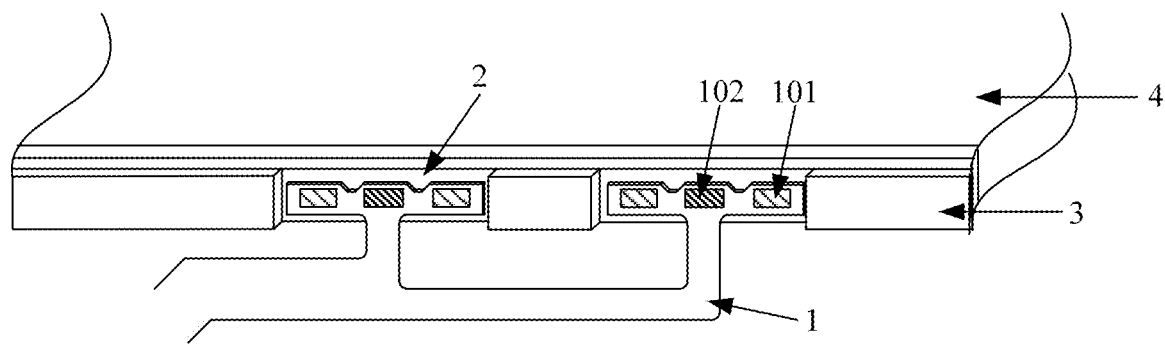
FIG. 5 is a schematic structural view of the flexible circuit board and the light bar of FIG. 4A being welded.
Figure 6:
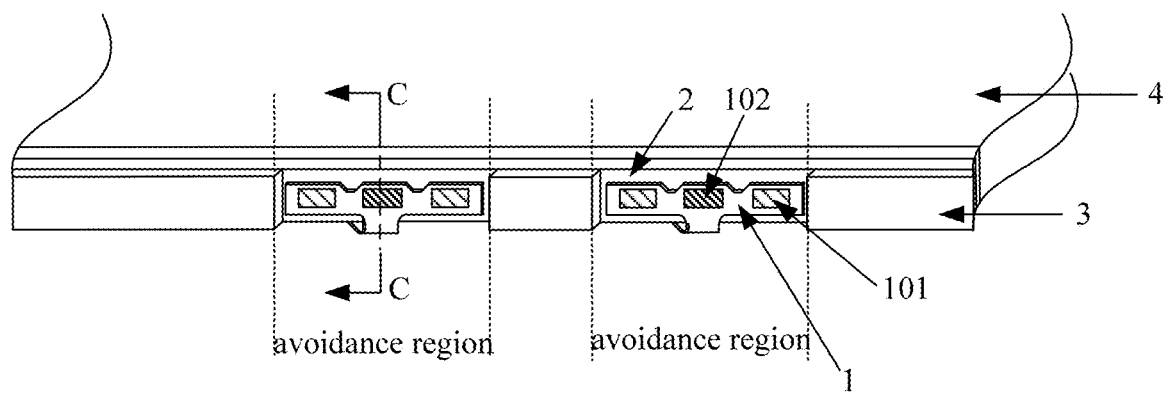
FIG. 6 is a schematic view of the flexible circuit board of FIG. 4A folded to a back side of the back plate after the flexible circuit board and the light bar are welded.

In order to overcome the drawback of effective welding joint breakage in the above embodiments, an exemplary embodiment of the present disclosure provides another flexible circuit board and light bar. FIG. 4A is a schematic structural view showing another flexible circuit board and light bar according to an exemplary embodiment of the present disclosure; FIG. 5 is a schematic structural view of the flexible circuit board and the light bar of FIG. 4A being welded; FIG. 6 is a schematic view of the flexible circuit board of FIG. 4A folded to a back side of the back plate after the flexible circuit board and the light bar are welded. As shown in FIGS. 4A, 5 and 6, the flexible circuit board 1 is used to be fixed to the light bar 2 and provide a signal for the light bar 2. The flexible circuit board 1 includes at least one effective welding portion 101 and at least one auxiliary welding portion 102. The effective welding portion 101 is configured to be fixed to a corresponding effective pad 201 on the light bar 2 and to transmit a signal loaded by itself to the corresponding effective pad 201. The auxiliary welding portion 102 is configured to be fixed to a corresponding auxiliary pad 204 on the light bar 2 to enhance firm fixing between the flexible circuit board 1 and the light bar 2.

In an exemplary embodiment of the present disclosure, the flexible circuit board 1 is provided with at least one auxiliary welding portion 102 in one-to-one correspondence with at least one auxiliary pad 204 preset on the light bar 2. During welding, not only the effective welding portion 101 on the circuit board 1 is welded and fixed to the effective pad 201 on the light bar 2, but also the auxiliary welding portion 102 on the flexible circuit board 1 is welded and fixed to the auxiliary pad 204 on the light bar 2. In case of a certain number of effective welding points, the exemplary embodiment of the present disclosure can increase the bearable maximum pulling force between the flexible circuit board 1 and the light bar 2 by adding auxiliary welding points (positions where the auxiliary welding portion 102 and the corresponding auxiliary pad 204 are welded), thereby avoiding breakage at the effective welding points.

It should be noted that the case of four effective welding portions 101 and two auxiliary welding portions 102 on the flexible circuit board 1 shown is merely exemplary and does not configure any limitation to the technical solution of the disclosure. It should be understood by those skilled in the art that the number of the effective welding portions 101 and the number of the auxiliary welding portions 102 are not limited herein.

In addition, the effective welding portion 101 and the auxiliary welding portion 102 on the flexible circuit board 1 in the present disclosure may have the same material, shape and size, but have substantially different structures and functions. Specifically, the effective welding portion 101 is electrically connected to a signal trace on the flexible circuit board 1 for transmitting a signal, while the auxiliary welding portion 102 is not electrically connected to the signal trace in the flexible circuit board 1. The effective welding portion 101 can not only be welded and fixed to the corresponding effective pad 201, but also provide a light emitting signal for the light bar 2, while the auxiliary welding portion 102 can only be welded and fixed to the corresponding auxiliary pad 204, but cannot provide a light emitting signal for the light bar 2.

In an exemplary embodiment of the present disclosure, the flexible circuit board 1 further includes: a circuit body 11, at least one lead portion 12 leading out of the circuit body 11, and at least one fixing portion 13 in one-to-one correspondence with the at least one lead portion 12 and in one-to-one correspondence with at least one welding region 5 preset on the light bar 2. Each fixing portion 13 is connected to an end of the corresponding lead portion 12 (e.g., the end 121 in FIG. 4B described below), the effective welding portion 101 and the auxiliary welding portion 102 are both located on the fixing portion 13, and each fixing portion 13 is provided with at least one effective welding portion 101 and at least one auxiliary welding portion 102.

It should be noted that, as shown in FIG. 4A, the light bar 2 is preset with at least one welding region 5 each provided with at least one effective pad 201 and at least one auxiliary pad 204 correspondingly. During welding, respective fixing portions 13 on the flexible circuit board 1 are firstly aligned with respective welding regions 5 on the light bar 2. Then, respective effective welding portions 101 on the fixing portions 13 are aligned with respective effective pads 201 in the welding portions 5, and respective auxiliary welding portions 102 on the fixing portions 13 are aligned with respective auxiliary pads 204 in the welding regions 5.

In an exemplary embodiment of the present disclosure, as shown in FIG. 4A, compared with the embodiment shown in FIG. 1, each fixing portion 13 is provided with at least one auxiliary welding portion 102 in addition to the effective welding portion 101. The auxiliary welding portion 102 can effectively enhance the firm fixing between the fixing portion 13 and the corresponding welding region 5.

Figure 7:
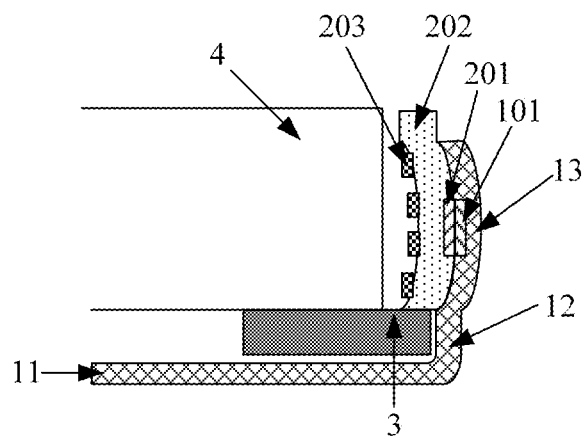
FIG. 7 is a cross-sectional view taken along line A-A of FIG. 3.
Figure 8:
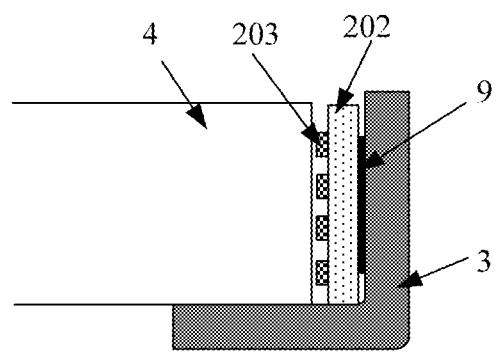
FIG. 8 is a cross-sectional view taken along line B-B of FIG. 3.

FIG. 7 is a cross-sectional view taken along line A-A of FIG. 3; FIG. 8 is a cross-sectional view taken along line B-B of FIG. 3. As shown in FIG. 8, the light bar 2 (specifically, an inner connecting plate 202 of the light bar 2) in the backlight module is typically adhered and fixed to a side wall of the back plate 3 with a double-sided tape 9. As shown in FIG. 7, a position on the side wall of the back plate 3 corresponding to the welding region 5 on the light bar 2 is designed as a hollow structure (i.e., the shown avoidance region) so that the flexible circuit board 1 is bent to the back side of the back plate 3.

In the embodiment shown in FIGS. 1 to 3, there is one welding region 5 on the light bar 2, and one lead portion 12 and one fixing portion 13 in the flexible circuit board 1, while all of the effective pads 201 are provided in the same welding region 5 and all of the effective welding portions 101 are provided on the same fixing portion 13, resulting in a greater length of the welding region 5. When a portion of the light bar 2 corresponding to the welding region 5 is not fixed by the back plate 3 and thus the welding region 5 becomes too long, as shown in FIG. 7, the portion of the light bar 2 corresponding to the welding region 5 may be easily deformed under a pulling force of the flexible circuit board 1. At this time, a distribution of the light emitting chips 203 corresponding to the welding region 5 on the light bar 2 is changed so that a light emitting brightness at the portion of the light bar 2 corresponding to the welding region 5 is not uniform, thereby causing an overall nonuniform light emitting brightness of the light bar 2 (i.e., a "light off" problem occurs). As a result, the light bar 2 emits nonuniform light to an optical device 4 (e.g., a light guide plate).

Figure 9:
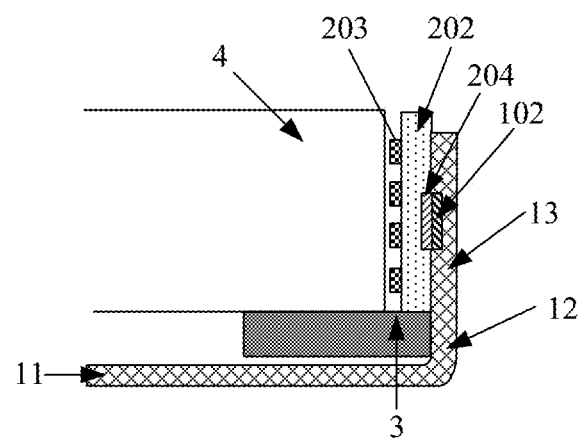
FIG. 9 is a cross-sectional view taken along line C-C of FIG. 6.

In order to solve the above technical problem, in the embodiment shown in FIGS. 4A, 5 and 6, a plurality of lead portions 12, i.e., a plurality of fixing portions 13, are provided, and correspondingly, a plurality of welding regions 5 are provided on the light bar 2. FIG. 9 is a cross-sectional view taken along line C-C of FIG. 6. As shown in FIG. 9, in case of a certain number of pads (including the effective pads 201 and the auxiliary pads 204) on the light bar 2, by providing a plurality of welding regions 5 and assigning the pads into the respective welding regions 5, the embodiment shown in FIGS. 4A, 5 and 6 may effectively reduce the length of the welding region (correspondingly reducing a length of the hollow region) compared with the embodiment shown in FIGS. 1 to 3, thereby preventing the portion of the light bar 2 corresponding to the welding region 5 from being deformed under the pulling force to some extent (the portion of the light bar 2 corresponding to the welding region 5 may be kept flat) and thus ensuring the overall uniform light emitting brightness of the light bar 2.

Figure 4B:
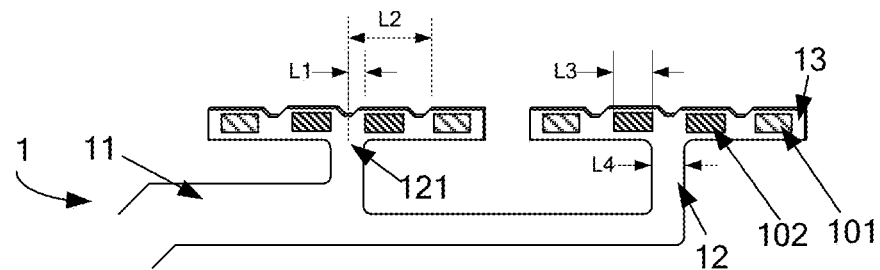
FIG. 4B is a schematic structural view of a variation of the flexible circuit board of FIG. 4A.

In an exemplary embodiment of the present disclosure, a variation of the flexible circuit board of FIG. 4A is provided. FIG. 4B is a schematic structural view of a variation of the flexible circuit board of FIG. 4A. As shown in FIG. 4B, one fixing portion 13 is provided with two auxiliary welding portions 102 disposed between two effective welding portions 101, and the end 121 of the lead portion 12 is connected to a middle position between the two auxiliary welding portions 102.

Figure 4C:
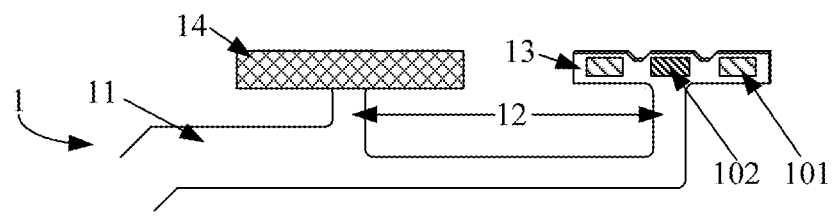
FIG. 4C is a schematic structural of another variation of the flexible circuit board of FIG. 4A.

In an exemplary embodiment of the present disclosure, another variation of the flexible circuit board of FIG. 4A is provided. FIG. 4C is a schematic structural view of another variation of the flexible circuit board of FIG. 4A. As shown in FIG. 4C, the flexible circuit board 1 further includes at least one pressing member 14. As shown on the left side of FIG. 4C, the at least one pressing member 14 is overlapped with at least one fixing portion 13 in one-to-one correspondence to press the fixing portion 13. Specifically, after the flexible circuit board 1 and the light bar 2 are welded and before the flexible circuit board 1 is folded to the back side of the back plate 3, the pressing member 14 is overlappedly disposed on the fixing portion 13, and two ends of the pressing member 14 are fastened (e.g., by welding, bonding or screwing, etc.) on the light bar 2 so that the pressing member 14 is pressed tightly against the fixing portion 13, thereby increasing the bearable maximum pulling force between the flexible circuit board 1 and the light bar 2 when the flexible circuit board 1 is folded to the back side of the back plate 3 to avoid breakage at the effective welding points. In addition, it should be understood that in FIG. 4C, for the purpose of illustrative explanation, only the fixing portion 13 on the left side is shown to be provided with the pressing member 14, but in fact, the fixing portion 13 on the right side is also provided with the pressing member 14. It should also be understood that two ends of the pressing member 14 may also be fastened (e.g., by welding, bonding or screwing, etc.) on a frame at a peripheral of the light bar 2 so that the pressing member 14 is tightly pressed against the fixing portion 13, thereby keeping the portion of the light bar 2 corresponding to the welding region 5 flat in addition to increasing the bearable maximum pulling force between the flexible circuit board 1 and the light bar 2 when the flexible circuit board 1 is folded to the back side of the back plate 3, and thus ensuring the overall uniform light emitting brightness of the light bar 2.

Figure 4D:
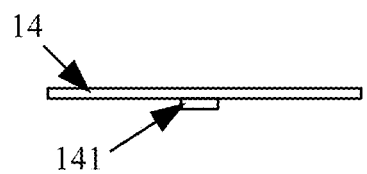
FIG. 4D is a side view of the pressing member of FIG. 4C.

FIG. 4D is a side view of the pressing member of FIG. 4C. In an exemplary embodiment of the present disclosure, as shown in FIG. 4D, the pressing member 14 includes a protrusion 141 configured to press the auxiliary welding portion 102. As shown in FIGS. 4A to 4C, the pulling force applied by the flexible circuit board 1 during bending acts on the lead portion 12 opposite to the auxiliary welding portion 102. Therefore, when the protrusion 141 of the pressing member 14 presses the auxiliary welding portion 102, it may result in an increased bearable maximum pulling force between the flexible circuit board 1 and the light bar 2 when the flexible circuit board 1 is folded to the back side of the back plate 3, so as to avoid breakage at the effective welding points.

It should be noted that the case where the number of the lead portions 12 and the number of the fixing portions 13 are two as shown in FIGS. 4A to 6 is merely exemplary, and does not configure any limitation to the technical solution of the disclosure. In the present disclosure, as the number of the effective welding portions 101 and the number of the auxiliary welding portions 102 increase, the number of the lead portions 12 and the number of the fixing portions 13 may also increase accordingly.

In an exemplary embodiment of the present disclosure, as shown in FIG. 4B, for any fixing portion 13, a distance between an auxiliary welding portion 102 on the fixing portion 13 furthest from the end 121 of the corresponding lead portion 12 and the end 121 of the corresponding lead portion 12 is marked as L1, a distance between an effective welding portion 101 on the fixing portion 13 closest to the end 121 of the corresponding lead portion 12 and the end 121 of the corresponding lead portion 12 is marked as L2, where L2 is greater than L1. It should be understood that, as shown in FIG. 4B, the distances L1, L2 refer to the distances from an edge of the effective welding portion 101 or the auxiliary welding portion 102 near a side of the lead portion 12 to a middle position of the end 121 of the lead portion 12. This is also applicable to the configuration shown in FIG. 4A. The fact that L2 is greater than L1 means that the lead portion 12 on which the flexible circuit board 1 applies the pulling force is close to the auxiliary welding portion 102 and away from the effective welding portion 101 so that the effective welding portion 101 and the effective pad 201 welded together are protected from being separated or broken by a greater pulling force.

Specifically, during the process of bending the flexible circuit board 1 to the back side of the back plate 3, a region where the bending occurs is located on the lead portion 12. At this tune, a greater stress on the lead portion 12 leads to a certain pulling force on the fixing portion 13 connected thereto, the certain pulling force causes a certain stress on the fixing portion 13, and the certain stress is converted into a pulling force at the welding points (including the effective welding points and the auxiliary welding points). Among that, the lead portion 12 applies a pulling force on the corresponding fixing portion 13 through the end 121. The closer the position on the fixing portion 13 to the end 121 of the lead portion 12, the greater the generated stress, and the greater the pulling force on the welding point at the position. On the other hand, the further the position on the fixing portion 13 away from the end 121 of the corresponding lead portion 12, the smaller the generated stress, and the smaller the pulling force on the welding point at the position. Therefore, the closer the welding point to the end 121 of the corresponding lead portion 12, the more likely it will be broken.

To this end, the auxiliary welding portion 102 in the present disclosure is disposed at a position closer to the end 121 of the lead portion 12, while the effective welding portion 101 is disposed at a position further from the end 121 of the lead portion 12, so as to reduce the pulling force on the effective welding joints. At this time, even if breakage occurs at part of the welding points, the welding points where the breakage first occurs are the auxiliary welding points, which will not affect the signal transmission between the flexible circuit board 1 and the light bar 2. Therefore, the technical solution of the present disclosure can improve reliability of the product.

In an exemplary embodiment of the present disclosure, as shown in FIG. 4A, each fixing portion 13 may be provide with one auxiliary welding portion 102 and two effective welding portions 101. Then, it is ensured that the welding region 5 on the light bar 2 is not too long while ensuring the firm fixing between the fixing portion 13 and the corresponding welding region 5, thereby preventing the portion of the light bar 2 corresponding to the welding region 5 from being deformed.

Further, the end 121 of the lead portion 12 is connected to the corresponding fixing portion 13 at a middle position where the one auxiliary welding portion 102 is located, and the two effective welding portions 101 are located at two sides of the one auxiliary welding portion 102, respectively. Since a distance between the effective welding portion 101 and the end 121 of the lead portion 12 is greater than a distance between the auxiliary welding portion 102 and the end 121 of the lead portion 12, after the fixing portion 13 is welded and the lead portion 12 is bent, the effective welding point is subjected to a pulling force smaller than the auxiliary welding point, thereby improving reliability of the product.

In an exemplary embodiment of the present disclosure, as shown in 4B, a length L3 of the auxiliary welding portion 102 in a length direction of the fixing portion 13 is greater than a width L4 of the lead portion 12 in the length direction of the fixing portion 13. Such arrangement allows the welded auxiliary welding portion 102 to withstand a greater pulling force, thereby protecting the effective weld points on both sides thereof. However, it should be understood that the length L3 of the auxiliary welding portion 102 in the length direction of the fixing portion 13 may be set to be smaller than the width L4 of the lead portion 12 in the length direction of the fixing portion 13 as needed.

Continue referring to FIGS. 4A to 6, the present disclosure further provides a light bar 2 fitted with the above flexible circuit board 1, and configured to be fixed to the flexible circuit board 1 and receive a signal provided by the flexible circuit board 1. The light bar 2 includes: at least one effective pad 201 and at least one auxiliary pad 204. The effective pad 201 is configured to be fixed to a corresponding effective welding portion 101 on the flexible circuit board 1 and to acquire a signal transmitted by the corresponding effective welding portion 101. The auxiliary pad 204 is configured to be fixed to a corresponding auxiliary welding portion 102 on the flexible circuit board 1 to enhance firm fixing between the flexible circuit board 1 and the light bar 2.

In an exemplary embodiment of the present disclosure, the light bar 2 is provided with at least one auxiliary pad 204 in one-to-one correspondence with the at least auxiliary welding portion 102 provided on the flexible circuit board 1. During welding, not only the effective pad 201 on the light bar 2 is welded and fixed to the effective welding portion 101 on the flexible circuit board 1, but also the auxiliary pad 204 on the light bar 2 is welded and fixed to the auxiliary welding portion 102 on the flexible circuit board 1. In case of a certain number of effective welding points, the present disclosure can increase the bearable maximum pulling force between the light bar 2 and the flexible circuit board 1 by adding auxiliary welding points, thereby avoiding breakage at the effective welding points.

It should be noted that the case of four effective pads 201 and two auxiliary pads 204 on the light bar 2 shown is merely exemplary and does not configure any limitation to the technical solution of the disclosure. It should be understood by those skilled in the art that the number of the effective pads 201 and the number of the auxiliary pads 204 are not limited herein.

Figure 10A:
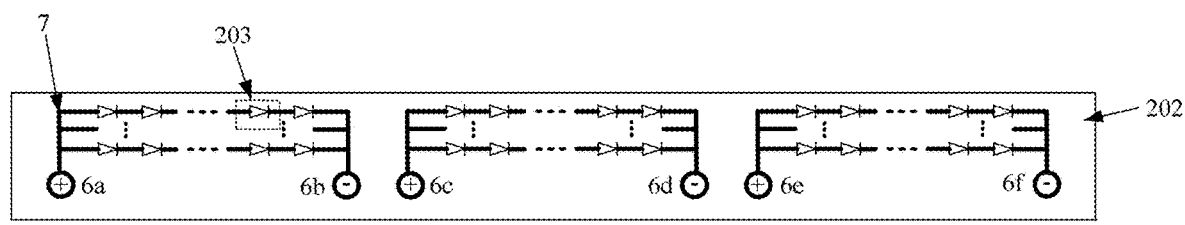
FIG. 10a is a schematic view showing a side of a light bar provided with a light emitting chip according to an exemplary embodiment of the present disclosure.
Figure 10B:
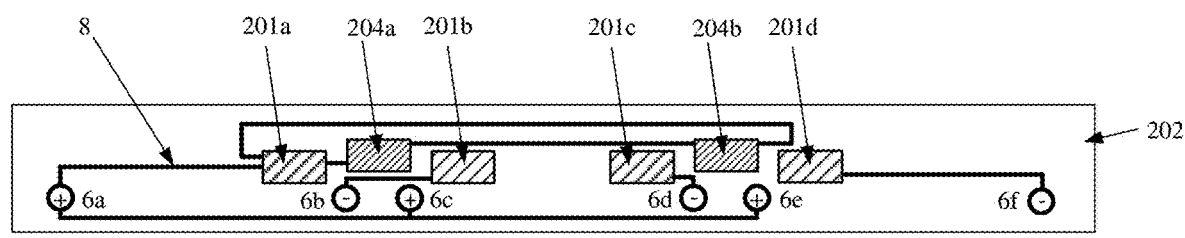
FIG. 10b is a schematic view showing a side of a light bar provided with a pad according to an exemplary embodiment of the present disclosure.

FIG. 10a is a schematic view showing a side of a light bar provided with a light emitting chip according to an exemplary embodiment of the present disclosure; FIG. 10b is a schematic view showing a side of a light bar provided with a pad according to an exemplary embodiment of the present disclosure. As shown in FIGS. 9, 10a and 10b, all the light emitting chips 203 on a side of an inner connecting plate 202 on the light bar 2 are divided into a plurality of light emitting groups (only three are exemplarily shown). The light emitting chips 203 in the same light emitting group are further divided into a plurality of light emitting sub-groups in a parallel relationship, and the light emitting chips 203 in the same light emitting sub-group are connected in series. Any one of the light emitting groups is provided with one corresponding positive electrode 6a/6c/6e and one corresponding negative electrode 6b/6d/6f. When the positive electrode 6a/6c/6e and the negative electrode 6b/6d/6f are both subjected to a voltage and a certain voltage difference is present, the corresponding light emitting group may emit light. The other side of the connecting plate 202 is provided with the above mentioned effective pad 201. Depending on the output object, the effective pad 201 may be divided into two types. Specifically, the effective pad 201 providing a signal for the positive electrode 6a/6c/6e is referred to as a positive electrode pad 201a, and the effective pad 201 providing a signal for the negative electrode 6b/6d/6f is referred to as a negative electrode pad 201b/201c/201d. To facilitate electrical connections between the positive electrode pad 201a and the corresponding positive electrode 6a/6c/6e, and between the negative electrode pad 201b/201c/201d and the corresponding negative electrode 6b/6d/6f (the negative electrode pad 201b corresponds to the negative electrode 6b, the negative electrode pad 201c corresponds to the negative electrode 6d, and the negative electrode pad 201d corresponds to the negative electrode 6f), a via is typically provided at a position of the connecting plate 202 corresponding to the positive electrode/negative electrode 6a/6b/6c/6d/6e/6f, where the positive electrode/negative electrode 6a/6b/6c/6d/6e/6f penetrates the connecting plate 202 through the corresponding via. The light emitting chips 203 are connected to one end of the corresponding positive electrode/negative electrode 6a/6b/6c/6d/6e/6f via a first signal trace 7, and the positive electrode/negative electrode pad 201a/201b/201c/201d is connected to the other end of the corresponding positive electrode/negative electrode 6a/6b/6c/6d/6e/6f via a second signal trace 8, thereby realizing the electrical connections between the positive electrode 6a/6c/6e and the positive electrode pad 201a, and between the negative electrode 6b/6d/6f and the negative electrode pad 201b/201c/201d.

Taking the case shown in FIGS. 10a and 10b as an example, it is assumed that all the light emitting chips 203 are divided into three light emitting groups, each of which is provided with one positive electrode 6a/6c/6e and one negative electrode 6b/6d/6f. In practical applications, considering that the voltages applied to the positive electrodes 6a/6c/6e of all the light emitting groups on the connecting plate 202 during the operation of the light bar 2 are the same, in order to reduce the number of effective pads 201, only one positive electrode pad 201a is provided for the three positive electrodes 6a/6c/6e, that is, the three positive electrodes 6a/6c/6e are connected to the same positive electrode pad 201a. However, each negative electrode 6h/6d/6f requires a corresponding negative electrode pad 201b/201c/201d, that is, the negative electrodes 6b/6d/6f and the negative electrode pads 201b/201c/201d are in one-to-one correspondence.

It should be noted that the case where a plurality of positive electrodes correspond to one positive electrode pad is only an exemplary solution in the present disclosure, which does not configure any limitation to the technical solution of the disclosure.

In an exemplary embodiment of the present disclosure, the auxiliary pad 204a/204b is connected in parallel with the positive electrode pad 201a. In the present disclosure, by connecting the auxiliary pad 204a/204b in parallel with the positive electrode pad 201a, an equivalent resistance between the positive electrode pad 201a and the positive electrode 6a/6c/6e can be effectively reduced, thereby ensuring accurate transmission of signals. Specifically, when the auxiliary pad 204a/204b is not connected in parallel with the positive electrode pad 201a, the equivalent resistance between the positive electrode pad 201a and the positive electrode 6a/6c/6e is a sum of a resistance of the positive electrode pad 201a, a resistance of the second signal trace 8, and a resistance of the positive electrode 6a/6c/6e; when the auxiliary pad 204a/204b is connected in parallel with the positive electrode pad 201a, since the equivalent resistance in parallel connection of the positive electrode pad 201a and the auxiliary pad 204a/204b is smaller than the resistance of the positive electrode pad 201a, the equivalent resistance between the positive electrode pad 201a and the positive electrode 6a/6c/6e is reduced.

It should be noted that the case where the two auxiliary pads 204a/204b in FIG. 10b are first connected in series through the second signal trace 8 and then connected in parallel with the positive electrode pad 201a through the second signal trace 8 is merely an exemplary solution in the present disclosure. In FIG. 10b, it is also possible that both of the auxiliary pads 204a/204b are directly connected in parallel with the positive electrode pad 201a (i.e., the two auxiliary pads 204a/204b are in a parallel relationship). Obviously, the above two technical solutions where the auxiliary pads are connected in parallel with the positive electrode pad are merely exemplary, and do not configure any limitation to the technical solution of the disclosure. It should be understood by those skilled in the art that in the present disclosure, when implementing parallel connection with the positive electrode pad, the number of auxiliary pads, the number of positive electrode pads, and the parallel manner of the auxiliary pads and the positive electrode pads (the auxiliary pad in directly parallel connection with one or more positive electrode pads, or a plurality of auxiliary pads first connected in series and then connected in parallel with one or more positive electrode pads) are not limited herein as long as at least one auxiliary pad is in parallel connection with at least one positive electrode pad. These technical solutions all fall into the scope of the present disclosure. The specific situations are not illustrated one by one herein.

In an exemplary embodiment of the present disclosure, the light bar 2 is divided into at least one welding region 5 which is in one-to-one correspondence with the at least one fixing portion 13 preset on the flexible circuit board 1. The effective pad 201 and the auxiliary pad 204 are both located in the welding region 5, and each welding region 5 is provided with at least one effective pad 201 and at least one auxiliary pad 204. For a detailed description of the welding region 5 on the light bar 2, reference may be made to the foregoing, and details are not repeated herein.

In an exemplary embodiment of the disclosure, a plurality of welding regions 5 may be provided. In case of a certain number of pads (including the effective pads 201 and the auxiliary pads 204), by providing a plurality of welding regions 5 and assigning the pads into the respective welding regions 5, the embodiment shown in FIGS. 4A to 6 may effectively reduce the length of the welding region 5 compared with the embodiment shown in FIGS. 1 to 3, thereby preventing the portion of the light bar 2 corresponding to the welding region 5 from being deformed under the pulling force to some extent and thus ensuring the overall uniform light emitting brightness of the light bar 2.

As a specific solution, each welding region 5 is provided with one auxiliary pad 204 and two effective pads 201. Then, it is ensured that the welding region 5 on the light bar 2 is not too long while ensuring the firm fixing between the welding region 5 and the corresponding fixing portion 13, thereby preventing the portion of the light bar 2 corresponding to the welding region 5 from being deformed. Further, the two effective pads 201 are respectively located at two sides of the one auxiliary pad 204 so as to correspond to the design where two effective welding portions 101 are located at two sides of one auxiliary welding portion 102 on the fixing portion 13 of the flexible circuit board 1, thereby improving reliability of the product.

By adding auxiliary welding portions and corresponding auxiliary pads, the flexible circuit board and the light bar provided by the present disclosure can increase the bearable maximum pulling force between the flexible circuit board and the light bar, thereby avoiding breakage at the effective welding points. In addition, the design of a plurality of fixing portions and a plurality of welding regions can reduce the length of the welding region while ensuring the firm fixing between the fixing portion and the welding region, prevent a portion of the light bar corresponding to the welding region from being deformed under a pulling force, and thus ensure the overall uniform light emitting brightness of the light bar.

The present disclosure further provides a light source. Continue referring to FIGS. 4A to 6, the light source includes a flexible circuit board 1 and a light bar 2. Among that, the flexible circuit board 1 is used to be fixed to the light bar 2 and provide a signal for the light bar 2. The flexible circuit board 1 includes at least one effective welding portion 101 and at least one auxiliary welding portion 102. The light bar 2 includes at least one effective pad 201 in one-to-one correspondence with the at least one effective welding portion 101, and at least one auxiliary pad 204 in one-to-one correspondence with the at least one auxiliary welding portion 102. The effective welding portion 101 is fixed to a corresponding effective pad 201 to transmit a signal loaded by itself to the corresponding effective pad 201. The auxiliary welding portion 102 is fixed to a corresponding auxiliary pad 204 to enhance the firm fixing between the flexible circuit board 1 and the light bar 2.

In an exemplary embodiment of the present disclosure, the flexible circuit board 1 further includes: a circuit body 11, at least one lead portion 12 leading out of the circuit body 11, and at least one fixing portion 13 in one-to-one correspondence with the at least one lead portion 12 and connected to an end 121 of a corresponding lead portion 12. The effective welding portion 101 and the auxiliary welding portion 102 are both disposed on the corresponding fixing portion 13. Each fixing portion 13 is provided with at least one effective welding portion 101 and at least one auxiliary welding portion 102. The light bar 2 is divided into at least one welding region 5 which is in one-to-one correspondence with the at least one fixing portion 13. The effective pad 201 and the auxiliary pad 204 are both located in the welding region 5, and each welding region 5 is provided with at least one effective pad 201 and at least one auxiliary pad 204.

In an exemplary embodiment of the present disclosure, a plurality of lead portions 12, i.e., a plurality of fixing portions 13, are provided, and correspondingly, a plurality of welding regions 5 are provided on the light bar 2. In case of a certain number of pads on the light bar 2, by providing a plurality of welding regions 5 and assigning the pads into the respective welding regions 5, the embodiment shown in FIGS. 4A to 6 may effectively reduce the length of the welding region compared with the embodiment shown in FIGS. 1 to 3, thereby preventing the portion of the light bar 2 corresponding to the welding region 5 from being deformed under the pulling force to some extent, and thus ensuring the overall uniform light emitting brightness of the light bar 2.

In an exemplary embodiment of the present disclosure, as shown in FIGS. 4A and 4B, on the fixing portion 13, a distance between an auxiliary welding portion 102 furthest from the end 121 of the corresponding lead portion 12 and the end 121 of the corresponding lead portion 12 is marked as L1; a distance between an effective welding portion 101 closest to the end 121 of the corresponding lead portion 12 and the end 121 of the corresponding lead portion 12 is marked as L2; where L2 is greater than L1. In the present disclosure, the auxiliary welding portion 102 is disposed at a position closer to the end 121 of the lead portion 12, while the effective welding portion 101 is disposed at a position further from the end 121 of the lead portion 12, thus reducing the pulling force on the effective welding joints and improving reliability of the product.

In an exemplary embodiment of the present disclosure, as shown in FIG. 4A, each fixing portion 13 is provide one auxiliary welding portion 102 and two effective welding portions 101, and each welding region 5 is provided with one auxiliary pad 204 and two effective pads 201. Then, it is ensured that the welding region 5 on the light bar 2 is not too long while ensuring the firm fixing between the welding region 5 and the corresponding fixing portion 13, thereby preventing the portion of the light bar 2 corresponding to the welding region 5 from being deformed. Further, the end 121 of the lead portion 12 is connected to the corresponding fixing portion 13 at a middle position where the one auxiliary welding portion 102 is located, the two effective welding portions 101 are located at two sides of the one auxiliary welding portion 102, respectively, the one auxiliary pad 204 is located at a middle position of the welding region 5, and the two effective pads 201 are located at two sides of the one auxiliary pad 204, respectively. Such configuration can improve reliability of the product.

In an exemplary embodiment of the present disclosure, as shown in 10b, at least one of the all effective pads 201 is a positive electrode pad with which the auxiliary pad 204 is connected in parallel. In the present disclosure, by connecting the auxiliary pad 204 in parallel with the positive electrode pad, an equivalent resistance between the positive electrode pad and the positive electrode can be effectively reduced, thereby ensuring accurate transmission of signals.

It should be noted that for more specific description of the flexible circuit board 1 and the light bar 2, reference may be made to the foregoing, and details are not repeated herein.

The present disclosure further provides a display device including the light source described above. The display device of the present disclosure also has the advantageous effects described above since it includes the light source of the present disclosure.

It should be understood that the above embodiments are merely exemplary embodiments for the purpose of illustrating the principle of the disclosure, and the disclosure is not limited thereto. Various modifications and improvements can be made by a person having ordinary skill in the art without departing from the spirit and essence of the disclosure. Accordingly, all of the modifications and improvements also fall into the protection scope of the disclosure.

What is claimed is:

1. A flexible circuit board for being fixed to a light bar to provide a signal for the light bar, the flexible circuit board comprising:
   a plurality of signal traces for transmitting light emitting signals;
   a plurality of effective welding portions configured to be fixed to a corresponding effective pad on the light bar and to transmit a signal loaded by itself to the corresponding effective pad;
   at least one auxiliary welding portion configured to be fixed to a corresponding auxiliary pad on the light bar to enhance firm fixing between the flexible circuit board and the light bar,
   a circuit body;
   a plurality of lead portions leading out of the circuit body; and
   at least one fixing portion disposed in one-to-one correspondence with the at least one lead portion,
   wherein the plurality of effective welding portions and the at least one auxiliary welding portion are arranged at intervals along one direction of the flexible circuit board,
   wherein the at least one of the auxiliary welding portion is arranged between adjacent effective welding portions of the plurality of effective welding portions,
   wherein each of the plurality of effective welding portions is electrically connected to each of the plurality of signal traces in one-to-one correspondence, and the at least one auxiliary welding portion is not electrically connected to any of the signal trace,
   wherein each fixing portion is connected to an end of a corresponding lead portion, the plurality of effective welding portions and the at least one auxiliary welding portion are both disposed on each of the at least one fixing portion,
   wherein the at least one lead portion has a plurality of lead portions,
   wherein on each fixing portion, a distance between an auxiliary welding portion of the at least one auxiliary welding portion furthest from the end of the corresponding lead portion and the end of the corresponding lead portion is marked as L1,
   a distance between an effective welding portion of the plurality of effective welding portions closest to the end of the corresponding lead portion and the end of the corresponding lead portion is marked as L2,
   where L2 is greater than L1,
   wherein a length of the auxiliary welding portion in a length direction of the fixing portion is greater than a width of the lead portion in the length direction of the fixing portion, and
   wherein on each fixing portion, distances between each of the at least one auxiliary welding portion and the effective welding portions adjacent to the auxiliary welding portion of the plurality of effective welding portions are equal.

2. The flexible circuit board according to claim 1, wherein the at least one lead portion has a plurality of lead portions.

3. The flexible circuit board according to claim 1, wherein each fixing portion is provided with one auxiliary welding portion of the at least one of the auxiliary welding portion and two effective welding portions of the plurality of effective welding portions respectively located at two sides of the one auxiliary welding portion.

4. The flexible circuit board according to claim 1, further comprising at least one pressing member that is overlapped with the at least one fixing portion in one-to-one correspondence to press a corresponding fixing portion.

5. The flexible circuit board according to claim 4, wherein the pressing member includes a protrusion configured to press the auxiliary welding portion.

* * * * *